US010970245B2

(12) United States Patent
Catiller

(10) Patent No.: US 10,970,245 B2
(45) Date of Patent: *Apr. 6, 2021

(54) PROCESSOR WITH RECONFIGURABLE PIPELINED CORE AND ALGORITHMIC COMPILER

(71) Applicant: ICAT LLC, Terre Haute, IN (US)

(72) Inventor: Robert Catiller, Terre Haute, IN (US)

(73) Assignee: ICAT LLC, Terre Haute, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/675,876

(22) Filed: Nov. 6, 2019

(65) Prior Publication Data

US 2020/0142851 A1 May 7, 2020

Related U.S. Application Data

(63) Continuation of application No. 15/919,885, filed on Mar. 13, 2018, now Pat. No. 10,515,041, which is a continuation of application No. 15/416,972, filed on Jan. 26, 2017, now abandoned.

(60) Provisional application No. 62/287,265, filed on Jan. 26, 2016.

(51) Int. Cl.
| G06F 9/44 | (2018.01) |
| G06F 13/40 | (2006.01) |
| G06F 8/41 | (2018.01) |
| G06F 15/78 | (2006.01) |
| G06F 30/331 | (2020.01) |

(52) U.S. Cl.
CPC .......... *G06F 13/4022* (2013.01); *G06F 8/447* (2013.01); *G06F 15/7867* (2013.01); *G06F 15/7889* (2013.01); *G06F 30/331* (2020.01); *Y02D 10/00* (2018.01)

(58) Field of Classification Search
None
See application file for complete search history.

(56) References Cited

U.S. PATENT DOCUMENTS

| 2001/0032327 A1* | 10/2001 | Lin | G06F 11/2733 714/723 |
| 2003/0066057 A1* | 4/2003 | RuDusky | G06F 30/327 717/140 |
| 2006/0081971 A1* | 4/2006 | Shau | H01L 22/32 257/690 |
| 2008/0218202 A1* | 9/2008 | Arriens | H03K 19/17758 326/38 |

(Continued)

*Primary Examiner* — Anna C Deng
(74) *Attorney, Agent, or Firm* — Christopher Paradies; Paradies Law P.A.

(57) ABSTRACT

An algorithmic matching pipelined compiler and a reusable algorithmic pipelined core comprise a system. The reusable algorithmic pipelined core is a reconfigurable processing core with a pipelined structure comprising a processor with a setup interface for programming any of a plurality of operations as determined by setup data, a logic decision processor for programming a look up table, a loop counter and a constant register, and a block of memory. This can be used to perform functions. A reconfigurable, programmable circuit routes data and results from one core to another core and/or IO controller and/or interrupt generator, as required to complete an algorithm without further intervention from a central or peripheral processor during processing of an algorithm.

14 Claims, 8 Drawing Sheets

(56) References Cited

U.S. PATENT DOCUMENTS

2012/0109849 A1* 5/2012 Chamberlain ...... G06F 9/44505
705/36 R
2014/0040552 A1* 2/2014 Rychlik ............. G06F 12/0815
711/122

* cited by examiner

US 10,970,245 B2

PROCESSOR WITH RECONFIGURABLE PIPELINED CORE AND ALGORITHMIC COMPILER

CROSS RELATED APPLICATIONS

This application is a continuation of U.S. patent application Ser. No. 15/919,885 filed Mar. 13, 2018 which claims priority to U.S. patent application Ser. No. 15/416,972 filed Jan. 26, 2017 which claims priority to U.S. Provisional Application 62/287,265 entitled Processor With Reconfigurable Algorithmic Pipelined Core And Algorithmic Matching Pipelined Compiler, which was filed on Jan. 26, 2016, which is incorporated herein in its entirety, by reference.

FIELD OF THE INVENTION

The field relates to computer programming and microprocessor design and programming, especially reconfigurable, pipelined and parallel processing of general purpose software instructions.

BACKGROUND

FIG. 1A illustrates a conventional processor's compiler. Conventional processors, such as Intel micro-processors and ARM micro-processors are well known. For example, a conceptual illustration of a conventional processor is shown in FIG. 1B. These processors are the heart of central processing units for modern computers and devices and are used to process algorithms. A problem with conventional processors is that these types of processors are general purpose and are not reconfigurable in any practical way that allows their performance to be enhanced for specific applications. Another problem is that the program execution control adds substantial overhead to processing of algorithmic functions, such as mathematical operations and logical decisions that modify the flow of processing. A higher level programming language may be used to program the conventional processor, and the compiler converts the instructions in the higher level programming language into machine code for the particular processor architecture. This machine code is provided to a memory location accessible by the processor and provides instructions for operation of the processor hardware, together with any BIOS or other calls provided by the system architecture. In most cases, mathematics and logical processing directions are directed to an arithmetic logic unit (ALU), which returns a solution to a program execution control portion of the processor, which manages overhead, such as guiding the processor through the correct order of solving mathematical algorithms, logic decisions, handling of data and the like. Machine code instructions are continuously fetched from program storage in order to control the processing of data. This overhead significantly limits machine performance.

For example, the following illustrates steps of a conventional compiler compiling a mathematical operation in a "C" programming language, which is an example of a higher level programming language that may be compiled to create machine code for a particular conventional processor. A simple mathematical operation assigns "var i1;" "var i2;" and "var s;" to define a data storage location for variable i1, i2 and result s. Then, an instruction "s=i1+i2;" may be used to sum the variables assigned in data locations i1 and i2. The compiler (a) first assigns storage locations for data (e.g. i1, i2 and s) and (b) generates source code into machine code. A conventional processor would retrieve all or a portion of the machine code from a memory location in which the code is stored. Then, it would execute the machine code. For this example, the central processing unit (CPU) would load i1 data in a memory location and send it to the ALU, load i2 data in a memory location and send it to the ALU, and instruct the ALU to add the data located in i1 and i2. Only then would the ALU perform an addition of the values located in the data locations for it and i2. This is the useful work step, with the setup by the CPU being overhead. Then, the CPU could get the ALU result from the data location for "s" and could send it to the input and output controller. This is a necessary step to present the result, if the result is not an intermediate step in the calculation. Conventional processors evolved out of a desire to save time in the development of computer programs, allowing higher level programming languages to be compiled for various architectures of central processing units and peripheral facilities. Also, all processes executed by the CPU can share a common ALU, by time sharing the ALU among various programs operating in the system environment.

Application specific integrated circuits (ASICs) are known that build into hardware electronic circuits capable of rapidly performing calculations for specific functions. These reduce overhead by hard wiring specific functions into the hardware.

Some field programmable gate arrays (FPGAs) are known that have a large number of logic gates and random access memory (RAM) blocks. These FGPAs are used to implement complex digital computations. Such FPGA designs may employ very fast input/output and bidirectional data buses, but it is difficult to verify correct timing of valid data within setup time and hold time. Floor planning enables resource allocations within FPGAs to meet these time constraints. FPGAs can be used to implement any logical function that an ASIC chip could perform. An ability to update the functionality after shipping, partial re-configuration of a portion of the design and a low non-recurring engineering cost relative to an ASIC design offers an advantage for some applications, even when the generally higher unit cost is taken into consideration.

However, the penetration of FPGA architectures has been limited to narrow niche products. An FPGA virtual computer for executing a sequence of program instructions by successively reconfiguring a group of FPGA in response to those instructions was patented in U.S. Pat. No. 5,684,980. FIG. 2 illustrates a structure for this FGPA architecture. This issued patent includes an array of FPGAs that changes configurations successively during performance of successive algorithms or instructions. The configuring of array of FPGAs allows an entire algorithm or set of instructions to be performed without waiting for each instruction to be downloaded in performing each computational step.

The developments in FGPAs and integration with processors gives the promise of the ability to be reprogrammed at "run time", but in reality, reconfigurable computing or reconfigurable systems to suit the task at hand are far from being implemented in practical applications due to the difficulties in programming and configuring these architectures for this purpose.

FIG. 2 illustrates a block diagram of a virtual computer including an array of field programmable gate arrays and field programmable interconnection devices (FPIN) or cross-bar switches that relieve internal resources of the field programmable gate arrays from any external connection tasks, as disclosed in U.S. Pat. No. 5,684,980, the disclosure and drawings of which are hereby incorporated herein in their entirety for the purpose of disclosing the knowledge of a skilled artisan, familiar with FPGAs.

FIG. 2 illustrates an array of field programmable gate arrays and field programmable interconnection devices that are arranged and employed as a co-processor to enhance the performance of a host computer or within a virtual computer processor to perform successive algorithms. The successive algorithms must be programmed to correspond with a series of conventional instructions that would normally be executed in a conventional microprocessor. Then, the rate of performing the specific computational task of the successive algorithms by the FPGA/FPIN array is much less than the rate of the corresponding instructions performed by a conventional microprocessor. The virtual computer of FIG. 2 must include a reconfigurable control section that governs the reconfiguration of the FPGA/FPIN array. The configuration bit files must be generated for the reconfigurable control section using a software package designed for that purpose. Then, the configuration bit file must be transmitted to a corresponding FPGA/FPIN array in the virtual computer. FIG. 2 illustrates how the arrays and dual port random access memory (RAM) are connected by pins to the reconfigurable control section, a bus interface and computer main memory. The bus interface is connected to a system bus.

U.S. Pat. No. 5,684,980 shows how the pins provide a clock pin and a pin connecting the reconfigurable control section to the FPGA/FPIN arrays, and shows an example of a reconfigurable control section.

U.S. Pat. No. 4,291,372 discloses a microprocessor system with specialized instruction formatting which works in conjunction with an external application dependent logic module handling specific requirements for data transfer to and from a peripheral device. The microprocessor provides a program memory having a specialized instruction format. The instruction word format provides a single bit field for selecting either a program counter or a memory reference register as the source of memory address, a function field which defines the route of data transfers to be made, and a source and destination field for addressing source and destination locations. Previously, peripheral controller units burdened the system with processor and control circuits in the base module for handling the specific requirements.

Digital Signal Processing (DSP) units or arrays of DSP processors may be hardwired into parallel arrays that optimize performance for some graphic intensive tasks, such as pixel processing for generating images on output screens, such as monitors and televisions. These are custom made and include a BIOS specific to the graphical acceleration environment created for the digital signal processors to do their job.

Matrix bus switching (MBS) is known. For example, the user guide "AMBA® 4 AXI4™, AXI4-Lite™, and AXI4-Stream™ Protocol Assertions, Revision: r0p1, User Guide," copyright 2010, 2012, referenced as ARM DUI 0534B, ID072312, teaches a system for matrix bus switching that is high speed and implementable by a person having ordinary skill in the art. The user guide is written for system designers, system integrators, and verification engineers who want to confirm that a design complies with a relevant AMBA 4 protocol. This can be AXI4, AXI4-Lite, or AXI4-Stream, for example. All of the trademarks are registered trademarks of ARM in the EU and elsewhere. Where excepted, this reference is incorporated herein in its entirety by reference. An MBS is a high speed bus for data input and output, and this reference teaches the methods and hardware for a system engineer to integrate an example of an MBS in a processor system architecture.

All of this is known in the art, but no example in the prior art eliminates almost all of the overhead generated by conventional processing systems, while maintaining the flexibility of processing a wide range of algorithms and using a standard higher level programming language, such as "C", for software development for the processing system.

SUMMARY

A pipelined, parallel processor on a chip comprises a processing unit and an array of reconfigurable, field programmable gates programmed by an algorithmic matching pipelined compiler, which can be a precompiler, such that the algorithmic matching pipelined compiler precompiles source code designed for operation on a standard processor without parallel processing for processing by the processing unit, and the processing unit and algorithmic matching pipelined compiler (referred to as AMPC or ASML) configures the field programmable gates to operate as pipelined, parallel processors. For example, the processor may be referred to as a reusable algorithmic pipelined core (RAPC). The parallel processors are configured to complete tasks without any further overhead from the processing unit, such as overhead for controlling an arithmetic processing unit.

In one example, a reusable algorithmic pipelined processor comprises a pool of computers configured to process algorithms in parallel using standard higher level software languages, such as "C", "C++" or the like. For example, the pool of computers are reprogrammed to run different algorithms as needed for a particular calculation, based on the output of the AMPC, which is set up with the RAPC resources available to it.

For example, a reusable algorithmic pipelined core (RAPC) may be comprised of three modules: an intelligent bus controller or logical decision processor (LDP), a digital signal processor (DSP), and a matrix bus switch. A logical decision processor (LDP) comprises reconfigurable logic functions, reprogrammable depending on need, for controlling of a master bus switch (MBS). A DSP comprises a reconfigurable mathematical processor for performing mathematical operations. In one example, all of the mathematical operations processed by the RAPC are processed by the DSP. In one example, all of the logic functions processed by the RAPC are processed by the LDP. A matrix bus router or switch (MBR or MBS) is defined as a reconfigurable, programmable circuit that routes data and results from one RAPC to another RAPC and from/to an input/output controller, and/or interrupt generators, as required, to complete an algorithm, without any further intervention from a central or peripheral processor during the processing of the algorithm. Thus, overhead is much reduced by pipelining compared to static, unreconfigurable hardware, which requires intervention by a central processor or peripheral processor to direct data and results in and out of arithmetic processing units. In one example, the LDP processes logical decisions and iterative loops and result memory is provided by the LDP for learning algorithms.

In one example, all of the mathematical operations processed by the RAPC are processed by the DSP, and all of the logic functions are processed by the LDP. In one example, a plurality of RAPC's are configured as a pool of cores and each of the pool of cores are reconfigurable by programming, alone, without any change to the hardware. For example, all of the RAPC's may be configured to process algorithms in parallel. In one example, the LDP uses memory blocks as Look Up Tables (LUT) and registers for constants or learned values. An n-bit LUT may be used to encode any n-input Boolean logic function as truth tables using the LUT set up by the LDP.

In one example, an algorithmic matching pipelined compiler (AMPC) generates machine code from a higher level, compilable software language, such as "C", "C++", Pascal, Basic or the like. Standard source code, written for a conventional, non-reconfigurable and non-pipelined, general purpose computer processor, may be processed by the AMPC to generate machine code for configuring one or more of the RAPCs. For example, the AMPC generates machine code from standard, preexisting code for a conventional ARM processor or a conventional Intel processor, and the machine code generated by this AMPC precompiler uses an ARM processor or an Intel processor to configure the RAPC's. Thus, a new computer system comprises a conventional processor, such as an existing ARM processor, Intel processor, AMD processor or the like, and a plurality of RAPC's, each RAPC comprising a DSP, LDM and MBS, for example. However, unlike existing co-processors or accelerators, the RAPC's are not merely peripheral co-processors. Instead, the RAPC's are reconfigured to independently solve complex mathematical and logic algorithms without further intervention by the conventional processor, after the precompiler or AMPC configures the RAPC's to do their job. Values are input into the configured RAPC and a solution is output to the MBS. In one example, a plurality of RAPC's are disposed on a single chip, such as a reconfigurable ASIC. Reconfigurable ASIC means a chip designed to comprise RAPC's such that each of the RAPC's is reprogrammable for specific operations by an AMPC and a general purpose, existing processor architecture, such as an ARM processor, an AMD processor, and Intel processor or the like. In this way, such a reconfigurable ASIC may contain 2000 RAPC's and may operate 360 trillion instructions per second with a 500 MHz clock speed. Thus, a single reconfigurable ASIC comprising 2000 RAPC's can operate 100 times faster than any conventional, general purpose processor today. All of the RAPC's may operate in a pipelined configuration, in parallel, while data is available. A single RAPC may execute instructions 100 times faster than a standard processor. A reconfigurable ASIC comprising 20 RAPC's, operating at a clock speed of 500 MHz, can execute 30 billion instructions per second. A single chip may comprise up to 2000 RAPC's in a conventionally sized ASIC. Therefore, a conventionally sized ASIC comprising 2000 RAPC's may execute instructions 200,000 times faster than a conventional processing system, without having to resort to specialized programming languages. Instead, existing programs may be ported over to operate with a reconfigurable ASIC comprising a plurality of RAPC's and benefit from pipelined execution of instructions, in parallel, without substantially rewriting existing high level programming. In one example, the AMPC precompiles existing code for an ARM general purpose processor architecture that is embedded on a reconfigurable ASIC comprising a plurality of RAPC's. This new processor architecture (ICAT) achieves surprising and unexpected performance by combining the ARM processor architecture and a plurality of RAPC's on a chip. The embedded ARM processor on the ICAT chip executes machine code instructions generated by the AMPC from preexisting programs written in a high level programming language, such as "C", which configure the plurality of RAPC's on the ICAT chip to perform surprisingly rapid execution of instructions per second. The ARM processor also controls intelligent monitoring, diagnostics and communications with peripherals external to the ICAT chip. Thus, to the outside world, the ICAT chip appears to be a very fast ARM processor that does not require a mathematical co-processor.

In an alternative example, the ICAT chip can embed an AMD processor and can appear to the outside world to be an AMD processor.

In yet another example, the ICAT chip can embed an Intel processor and appears to the outside world as an Intel processor.

Surprisingly, even though the ICAT chip appears to the outside world to be a standard, non-reconfigurable and non-pipelined processor, capable of executing instructions at a rate merely equivalent to the standard processor, the ICAT chip executes instructions at a surprising and unexpected rate, 100 to 200,000 times faster than the standard processor that faces the world, without rewriting programs written for the standard processor. This simplification over the burdensome chore of rewriting code to function on FPGA's finally makes the use of FPGA's accessible to ordinary programmers. The AMPC does not generate the run-time code for the ICAT chip, in one example. Instead, it precompiles the program and separates out instructions that are best suited to the RAPC's. Then, the AMPC generates code for setting up each of a plurality of RAPC's on the ICAT chip (or elsewhere, in one example, using multiple ICAT chips operating in parallel), which RAPCs then operate pipelined and in parallel. Alternatively, the RAPC's may be reconfigured in real time, based on instructions received by the ICAT or on historical instructions previously received by the ICAT chip. Thus, the ICAT chip can learn over time to operate at faster and faster speeds, if the ICAT chip is consistently used for similar purposes. This occurs, naturally, if the RAPC's are configured in real time to solve new logical and mathematical equations, while keeping the old logical and mathematical configurations in place on a first in first out or last used last reconfigured basis, for example. A set of RAPC's reconfigured for a specific purpose, if used frequently, will not be reconfigured to another purpose until there are no other RAPC's available for new algorithms requiring RAPCs, if a last used last reconfigured algorithm is adopted, for example. In this way, the most used algorithms will not need to be configured but will be preconfigured, already, by previous use.

The RAPC's, when configured by the central processing unit, operate without overhead, executing instructions until the math, logic and iterative instructions for which the RAPC have been configured are completed.

In one example, the ICAT chip comprises setup registers, and the AMPC generates instructions for setting up the setup registers of the ICAT chip, which configures the RAPC's to complete particular instructions. The RAPC's operate continuously, without further oversight by the central processing unit, when initialized. In one example, the AMPC receives RAPC hardware data from a hardware compiler, such as a Verilog or Vivado hardware compiler.

Hardware files may be generated by the hardware compiler and may be used by the AMPC to generate code that writes configuration data for the setup registers of the ICAT chip (or the setup registers of a plurality of ICAT chips, in one example).

In one example, the AMPC extracts configuration data for the setup registers of an ICAT chip from a program written for a standard processing architecture in a high level programming language, such as "C". For example, the AMPC ignores overhead instructions and generates code for the setup registers of the ICAT chip from the program for 1) arithmetic instructions and data; 2) logic decisions and data;

and 3) branch or call/return instructions and destinations; 4) iterative loops, decisions and data; 5) DSP setup routines and data; and 6) code entry point labels for loops and branches. For example, the AMPC uses these instructions to configure the setup registers of the ICAT, configuring the DSP for completion of mathematical algorithms, the LDP for logical decisions and values for lookup tables of the LDP, and the MBS for branch, call and return destination label mapping to entry points in the various processing algorithms and assigned addresses in the ICAT hardware. For example, RAPC hardware tables are built for each RAPC and contain the DSP, LDP and MBS configuration tables. For example, DSP, LDP and MBS are configured as frequently used in RAPC's, but when DSP or LDP are not needed, then an RAPC may be reconfigured even to omit this common structure by the AMPC and ICAT architecture. So, while DSP, LDP and MBS are present in some of the RAPC's, other RAPC's may have a different structure, specific to the code to be run on the ICAT processor.

In one example, an ICAT architecture and AMPC are dependent one on the other for the hardware capable of being reconfigured by the AMPC. For example, the AMPC may implement a branch or call of a destination within the ICAT architecture by directly connecting results or data to the destination, if the destination RAPC is nearby, or data is being routed from a DSP to a LDP or vice versa, for example, making the results or data immediately available for execution of instructions, without any overhead. Alternatively, the AMPC may implement a branch or call of a destination using the MBS, and results and data are transported on a high speed streaming interface to the destination, which may be another RAPC or other destination, making the data available for further execution of instructions via the high speed streaming interface to the destination.

In one example, the AMPC is aware of the RAPC resources, which are assigned by the AMPC while precompiling code written in the high level programming language. Thus, the ICAT architecture may be configured by the AMPC to optimize usage of the RAPC resources, such as by minimizing interconnect length between instructions executed by the plurality of RAPC's. This optimization may be completed by an interative approach or a trial and error approach. In one example, the AMPC comprises a leaning algorithm that improves the optimizations based on historical patterns of usage of certain instructions, whether mathematical algorithms, logical algorithms or a combination of mathematical and logical algorithms, such as by minimizing the use of the MBS for branch or call of a destination for common instruction sets. For an example of an MBS implementation, see the ARM MBS example in the background.

In one example, an RAPC is integrated into a chip with a conventional processor for configuring the RAPC and an AMPC for compiling conventional high level source code into instructions for the conventional processor to set up the RAPC. The RAPC comprises a DSP, an LDP and an MBS. In this example, each DSP has a setup interface for programming any of a plurality of operations, such as integer and floating point math, such as multiply, divide, add, subtract and other mathematical functions. A DSP may have for inputs for operand data that can be concatenated or operated on with various combinations of mathematic functions as determined by the setup data. In this example, each DSP has a 48 bit accumulator which is output as result data along with the status data. Status data includes, carry out, equal, greater than, and less than, for example. In this example, each LDP has a setup interface for programming a lookup table, a loop counter, and a constant register. Each LDP has a "Loop Counter" for detecting when iterative algorithms are completed. Each LDP has a register that can hold constant data for input to the lookup table. Each LDP has a block of memory, which can be used to perform functions. Lookup table functions may include a lookup table that can be implemented and sequentially accessed using the loop counter; a lookup table that can be implemented and accessed by the DSP status, the constant register, or the DSP result data for control purposes; and a logic lookup table that can be implemented and output miscellaneous logic signals for control purposes, for example. The LDP may pass result data from its input to its output. The LDP may have one pipeline register for result data at its output, for example. Alternatively, the LDP may have two pipeline registers with synchronous clear enables for result data at its output. For example, the chip may be an ICAT chip comprising a plurality of the RAPC's, each comprising a DSP, an LDP and an MBS and each being setup by code provided by the AMPC to a conventional processor.

In one example, an AMPC comprises a compiler having an input architecture for defining the number of a plurality of RAPC's and locations of the plurality of RAPC's. The AMPC filters high level source code and identifies mathematical and logical algorithms capable of being optimized by configuration of one or more of the plurality of RAPC's. For example, if a video processing, mathematical or logical algorithm is identified, the AMPC sets up the DSP, LDP and MBS of one or more of the RAPC's to perform the video processing, mathematical and/or logical algorithm. For example, the AMPC creates machine code from a "C" language source code for operation of a conventional processor, such as an ARM processor, and the ARM processor sets up each of the DSP, LDP and MBS portions of each of the RAPC's that will be used in processing data input to the processor and outputting data from the processor.

To systems outside of the processor, an ICAT processor will appear to be an unusually fast conventional processor. Within the processor, the DSP's, LDP's and MBS's of the RAPC's will be processing data at a rate tens, hundreds, even thousands of times faster than a conventional, single core processor. For each RPAC, the DSP will perform its operation on a first clock, the LDP will test the result and output a control decision and result data on a second clock, and the MBS will route result data to one of two destinations based on the control data on a third clock. Thus, each RAPC will have a latency of 3 clocks from DSP to MBS. For streaming data, once initiated, the MBS may output data on each subsequent clock after the latency period.

In one example, a system for configuring a reconfigurable processor comprises a non-reconfigurable processor, a plurality of reconfigurable cores, and an Algorithmic Matching Pipelined Compiler capable of accepting code written in a high level programming language for the non-reconfigurable processor, wherein the Compiler identifies code written in the high level programming language that could benefit from pipelining available on one or more of the plurality of reconfigurable cores and outputs code for the non-reconfigurable processor to set up the one or more of the plurality of non-reconfigurable processors.

In one example, a processor comprises a non-reconfigurable processor core and a plurality of Reusable Algorithmic Pipelined Cores coupled to the non-reconfigurable processor core such that the non-reconfigurable processor core is capable of configuring and reconfiguring each of the plurality of Reusable Algorithmic Pipelined Cores as a result of instructions received from an Algorithmic Matching Pipelined Compiler. For example, the processor is contained in a single chip. In one example, each Reusable Algorithmic Pipelined Core comprises a DSP, an LDP and an MBS, and the DSP is pipelined to the LDP, and the LDP is pipelined to the MBS, such that the non-reconfigurable processor does not control any of the processing that occurs within each Reusable Algorithmic Pipelined Core.

Definitions

An Algorithmic Matching Pipelined Compiler or AMPC is a compiler capable of accepting code written in a high level programming language for a conventional non-reconfigurable processor, wherein the AMPC identifies code written in the high level programming language that could benefit from pipelining available on a reconfigurable core or processor, such as an RAPC or Filed Programmable Gate Array, and outputs code for a non-reconfigurable processor, which instructs the non-reconfigurable processor to configure the reconfigurable core or processor, prior to providing instructions for using the reconfigurable core or processor. A Reusable (or reconfigurable) Algorithmic Pipelined Core (or computer) or RAPC is defined as a reconfigurable processing core with a pipelined structure comprising a DSP including a setup interface for programming any of a plurality of operations, such as integer and floating point math, with four inputs for operand data that can be concatenated or operated on with various combinations of mathematic functions as determined by the setup data, and a 48 bit accumulator which is output as result data along with the status data; an LDP having a setup interface for programming a lookup table, a loop counter and a constant register and a block of memory, which can be used to perform functions; and an MBS. An MBS is defined as a reconfigurable, programmable circuit that routes data and results from one RAPC to another RAPC and from/to an input/output controller, and/or interrupt generators, as required, to complete an algorithm, without any further intervention from a central or peripheral processor during the processing of the algorithm.

BRIEF DESCRIPTION OF THE DRAWINGS

The following drawings are illustrative examples and do not further limit any claims that may eventually issue.

When the same reference characters are used, these labels refer to similar parts in the examples illustrated in the drawings.

DETAILED DESCRIPTION

Figure 1A:
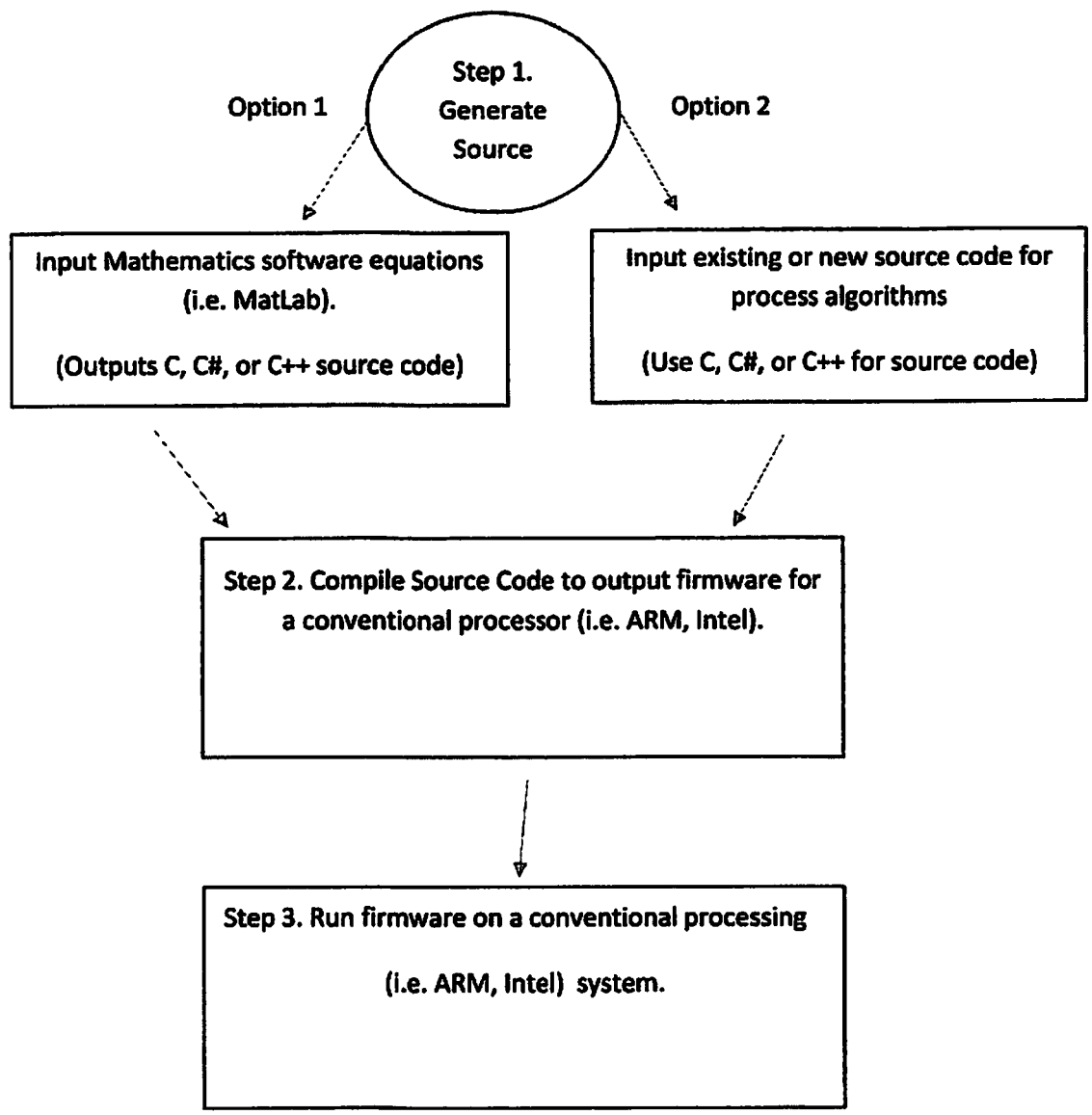
FIG. 1A illustrates a prior art flow chart for a conventional compiler.

For example, an ICAT architecture mimics any standard microprocessor unit architecture. Its architecture takes advantage of pipelining and a much richer gate density in an integrated circuit designed to be configured by a customer or a designer after manufacturing, such as one or more field programmable gate arrays (FPGA's) to achieve a 100:1 advantage in MIPS when a 1:1 comparison is made with a single standard microprocessor architecture with the same clock speed. FPGAs contain an array of programmable logic blocks, and a hierarchy of reconfigurable interconnects that allow the blocks to be "wired together", like many logic gates that can be inter-wired in different configurations. Logic blocks can be configured to perform complex combinational functions, or merely simple logic gates like AND and XOR. In most FPGAs, logic blocks also include memory elements, which may be simple flip-flops or more complete blocks of memory.

The very large jump in performance allows the processor to be used for data intensive applications, such as machine vision, video processing, audio processing, robotics control systems, multi-axis control systems, mobile communications, virtual reality, artificial intelligence, livestreaming, biometric monitoring, the Internet of Things, supercomputing, quantum computing, aerospace control systems, simulation and modeling of complex systems, and signal processing applications, for example.

In one example, less power is used for computationally intensive processing of algorithms. For example, the ICAT architecture provides a 100 to 1 reduction in energy usage for the same calculation implemented on a standard microprocessing unit, more preferably a 1000:1 advantage, reducing heat and power consumption.

In one example, the ICAT may be run in a configuration of as many parallel processors as needed for an application, increasing performance even further compared to standard microprocessors. For example, a plurality of processor architectures may be run simultaneously. For instance, legacy code may be run on a virtual machine compatible with the legacy code, while a new virtual machine runs code written specifically for the new architecture. In one example, this reduces the need for extensive regression testing, such as would be required for adapting legacy code to the new system architecture.

In one application, the speed and expandability of the ICAT architecture is applied to legacy systems incapable of processing the volume of data required for raw speed and expandability for customers whose code and/or hardware has run into limitations.

In one example, reconfiguration is compiled at or before power up, greatly simplifying planning with little impact on final product performance. For example, an FPGA is a host hardware for this architecture. Millions of instructions per second (MIPS) may be added, easily, without major rewrites to existing code. Existing code may be run almost unmodified, except for recompilation of the existing code. For example, algorithms requiring parallel processing of a large number of common inputs are ideal candidates for this ICAT architecture.

In one example, old and new processors run in parallel. Existing code may be recompiled and run nearly untouched, with a minimum of regression testing to ensure changes have not occurred. Exceptions will be where timing affects operations of the architecture and where hardware peripherals are altered. For example, an ICAT architecture may be used to increase raw computational speed, and acceleration of code may be implemented by converting hardware when needed.

In one example, the ICAT architecture comprises a front end pre-compiler that catches any potential code incompatibility issues. This front end pre-compiler automatically resolves these potential code incompatibility issues. For example, the ICAT architecture may emulate a variety of processor architectures familiar to different developers. For example, the ICAT architecture may emulate more than one processor, allowing a project to be coded for a plurality of developers' favored processors and to run code on a plurality of different virtual processors at the same time. In one example, a plurality of different processors would run different code sets in a multi-processing environment, and program developers compile code for one of the plurality of the domains compatible with the code.

In one example, the pre-compiler is an algorithmic matching pipelined compiler, which generates hardware configuration code needed for various processing algorithms. Firmware for configuring the ICAT architecture may be generated from logical and mathematical equations for a plurality of processing tasks. For example, a plurality of processors may be configured in a matrix array for running a mixture of low and high performance tasks.

The ICAT architecture includes processing code developed using a higher level language, because the ICAT architecture provides a raw speed advantage that overwhelms any speed advantage gained by programming in machine language applicable only to one specific multi-processing environment, substantially reducing the time to complete a development project.

Figure 1B:
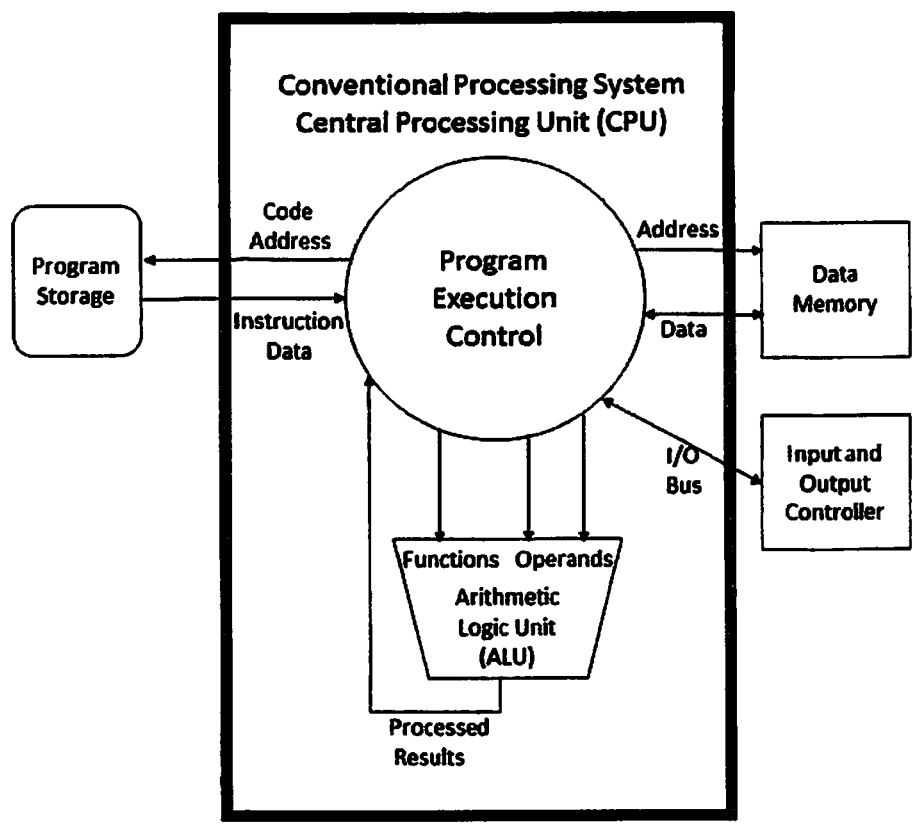
FIG. 1B illustrates a prior art processor for a conventional computer.
Figure 2:
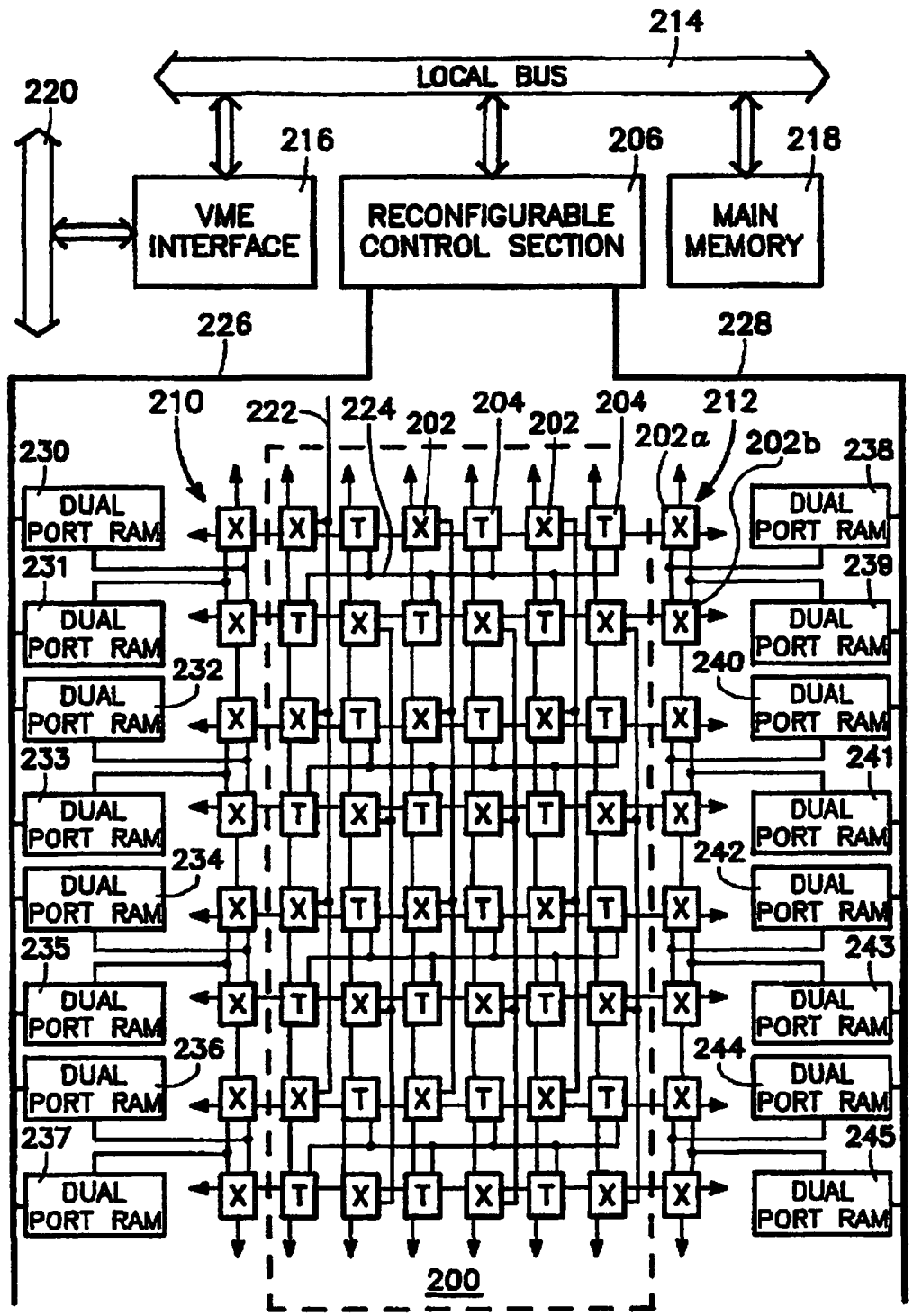
FIG. 2 illustrates a block diagram from U.S. Pat. No. 5,684,980.
Figure 3:
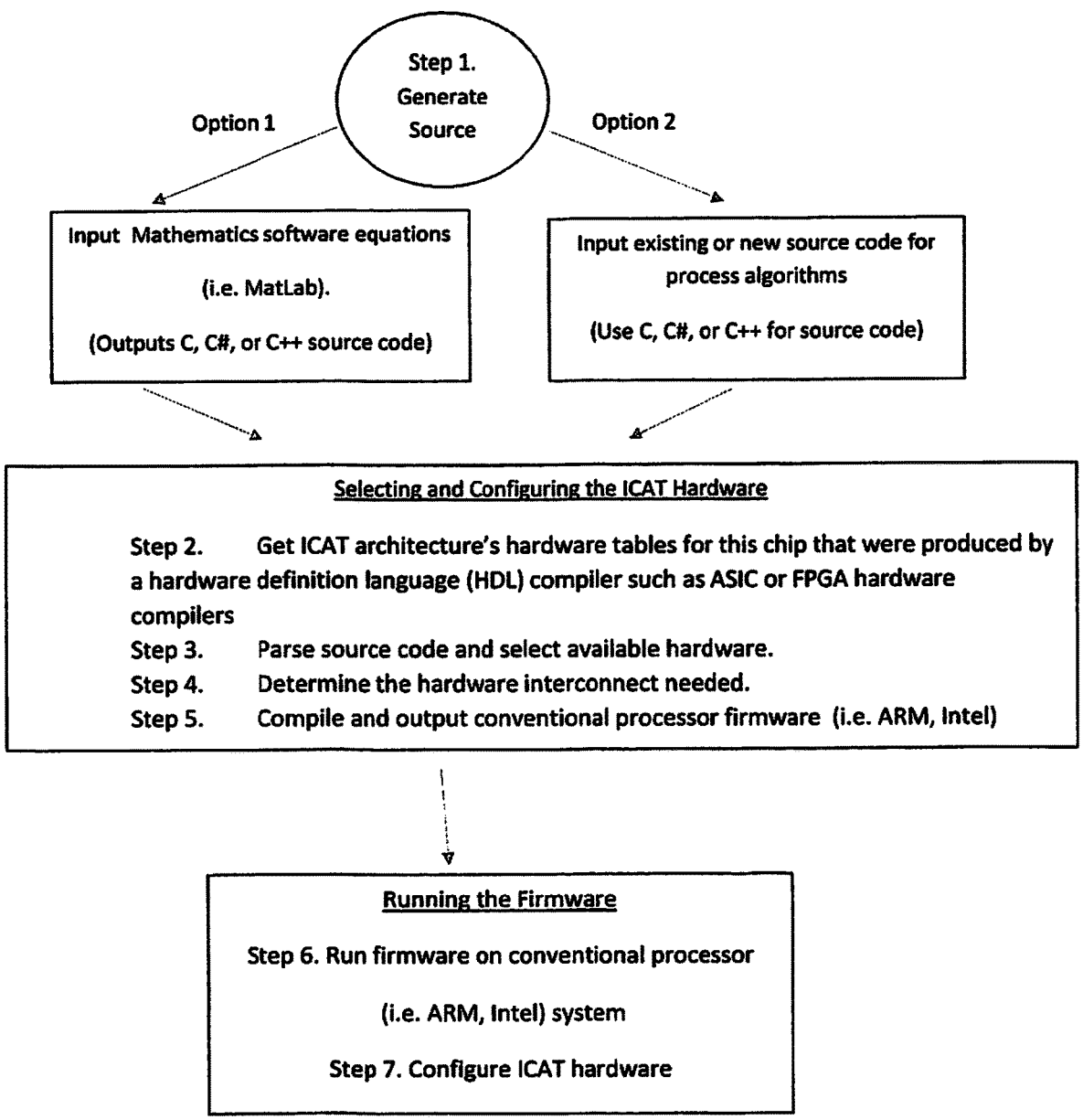
FIG. 3 is a flow chart illustrating an example of an AMPC compiler for comparison with the flow chart in FIG. 1A.

The ICAT architecture includes a compiler or pre-compiler, which checks legacy code for hardware specific commands, which is optimized for use with a high level programming language, such as C or C++. A comparison of FIG. 1 and FIG. 3 illustrates the additional steps included in an Algorithmic Matching Pipelining Compiler (AMPC), for example.

In one example, a set of standard multi-processing/multitasking peripherals, with in-built coordination, is provided by the ICAT architecture. A real time operating system (RTOS) may be adopted. For example, a multi-tasking, real time operating system is incorporated into the ICAT architecture. For example, Micro-Controller Operating Systems (MicroC/OS) is a real-time operating system designed by embedded software developer, Jean J. Labrosse in 1991. It is a priority-based pre-emptive real-time operating system for microprocessors, written mainly in the C programming language, a higher level programming language. The raw speed of the ICAT architecture allows use of such a RTOS, for example. MicroC/OS allows definition of several functions in the C language, each of which can execute as an independent thread or task. Each task runs at a different priority, and each task thinks that it owns a virtual processor of the ICAT architecture. Lower priority tasks may be preempted by higher priority tasks, at any time. Higher priority tasks may use operating system services, such as a delay or event, to allow lower priority tasks to execute. There are operating system services provided for task management, inter-task communication, memory management, and for timing MicroC/OS. MicroC/OS is open source and adaptable to several different processor architectures.

PCBA layout software and engineering tools are provided for the ICAT architecture in order to allow existing designs to be converted to the ICAT architecture.

In one example, a pipelined architecture is achieved using standard Verilog or VHDL code. For example, a 1024 word instruction cache, a data cache, and multi-level memory cache architectures may be provided in the ICAT architecture. Pipelining of the ICAT architecture may include a learning algorithm that detects which way branching on decision processing tends to occur, making that path the default path on future passes through the learning algorithm. In another example, interrupt code is isolated, and an interrupt handler is dedicated to specific inputs, with a private code location. In one example, the ICAT architecture includes a multi-processor debugger. For example, existing code may be processed by a pre-processing debugger to ensure that the existing code is well partitioned, so that the functions are separated. Then, a single debugger may be run on each independent thread of an operation.

For example, a reconfigurable algorithmic pipelined core (RAPC) may be provided in a 2 inch chip package that provides MIPS and Mega FLOPS equivalent to more than 1000 Intel i7 micro-processors, more preferably more than 10,000 Intel i7 micro-processors.

In one example, the ICAT architecture is compatible with existing debug tools. In another example, the ICAT architecture is implemented to run existing, legacy code that does not contain interprocessor communications. ICAT specific hardware is unified as a single, well debugged block common to all legacy code. For example, peripherals that exactly mimic the main functions of common multi-processing units are cloned for the ICAT architecture. For example, superset peripherals allow hardware arrangements easily arranged by customers.

In one example, the ICAT architectures compiler or pre-compiler detects low level code timing loops that count clock cycles, delays that allow instruction fetching, and other incompatible timing code, and flags these for repair or replacement, either manually or automatically, with compatible higher level programming provided within the ICAT architecture.

In one example, the ICAT architecture provides a 4:1 MIPS advantage over traditional architectures. In another example, the advantage is at least 100:1.

In one example, the ICAT architecture comprises an algorithmic matching pipeline compiler (AMPC), which is a compiler accepting processing algorithms in standard source code formats. The AMPC generates firmware for a conventional processing system operable with the ICAT architecture. The compiler generates instructions that configure the ICAT hardware, such that the architecture processes algorithms with improved performance compared to traditional micro-processors that are not reconfigurable by the AMPC. Specifically, the AMPC uses pipelining to optimize processor performance for applications requiring algorithmic intensive computational processing. For example, this firmware may be run on a conventional processing system to configure ICAT(s) hardware architectures that process algorithms with optimal performance.

In one example, the AMPC provides a compiler that compiles conventional compiler source code capable of generating code for operating the ICAT hardware configuring the ICAT architecture's processor resources to directly process algorithms. For example, the AMPC utilizes source code that is compatible with conventional compilers, such as C, C #, C++, Matlab or other conventional compilers.

In one example, firmware generated by the AMPC runs on a main processing system of the ICAT architecture. For example, the main processing system is a conventional processor on the same chip as the remainder of the ICAT architecture and operates seamlessly with the ICAT architecture. In this example, the AMPC accepts code written in high level programming languages for source code, such as C, C #, C++, and the AMPC outputs firmware for the ICAT architecture that runs on the main processing system. This simplifies the coding for operation of the ICAT architecture by allowing the firmware for the ICAT architecture to be programmed in a higher level programming language familiar to the developer. The raw speed of the ICAT architecture eliminates the penalty and reduces any need to program machine level code for optimizing speed. Instead, the higher level programming language optimizes the firmware for optimizing performance based on the algorithms to be solved for a particular application. For example, the ICAT architecture is reconfigurable to allow optimal performance, on at least one virtual machine defined in the firmware, for robotic vision systems, as an example.

Unlike traditional micro-processors, in one example, the AMPC of the ICAT architecture may compile software syntax, such as an if-then-else process, into firmware that reconfigures the ICAT architecture's hardware to optimally execute the process in fewer clock cycles, using pipelining, for example. By running the firmware, the ICAT architecture is configured. In contrast, conventional compilers build firmware that all conventional processors use, but the conventional processors are not reconfigured by the firmware. The AMPC builds firmware for the ICAT architecture, configuring the ICAT architecture for optimal operation in a particular application, for example. In one example, the AMPC selects and structures the configuration of the ICAT hardware using the algorithms as input structure for the ICAT architecture's processor hardware.

For example, the hardware architecture of the ICAT architecture is optimized by the AMPC for processing speed performance for a particular application, when configured by the AMPC generated firmware. The AMPC can reconfigure the hardware of the ICAT architecture, where a conventional compiler cannot reconfigure the ICAT or any micro-processor's hardware.

A standard system compiler cannot change architecture of the hardware in conventional processor systems. However, in one example, the AMPC generates firmware that configures the ICAT architectures processors to directly perform pipelined processing and routing of data based on prior results in hardware. For example, the if-then-else logic statement input into the AMPC would structure the hardware of the ICAT architecture to route data results to the next ICAT. In this example, the AMPC generates hardware configurations eliminating overhead of conventional processing systems, such as code fetching, data loading, data storing, branching, and subroutines for the same if-then-else logic.

Figure 4:
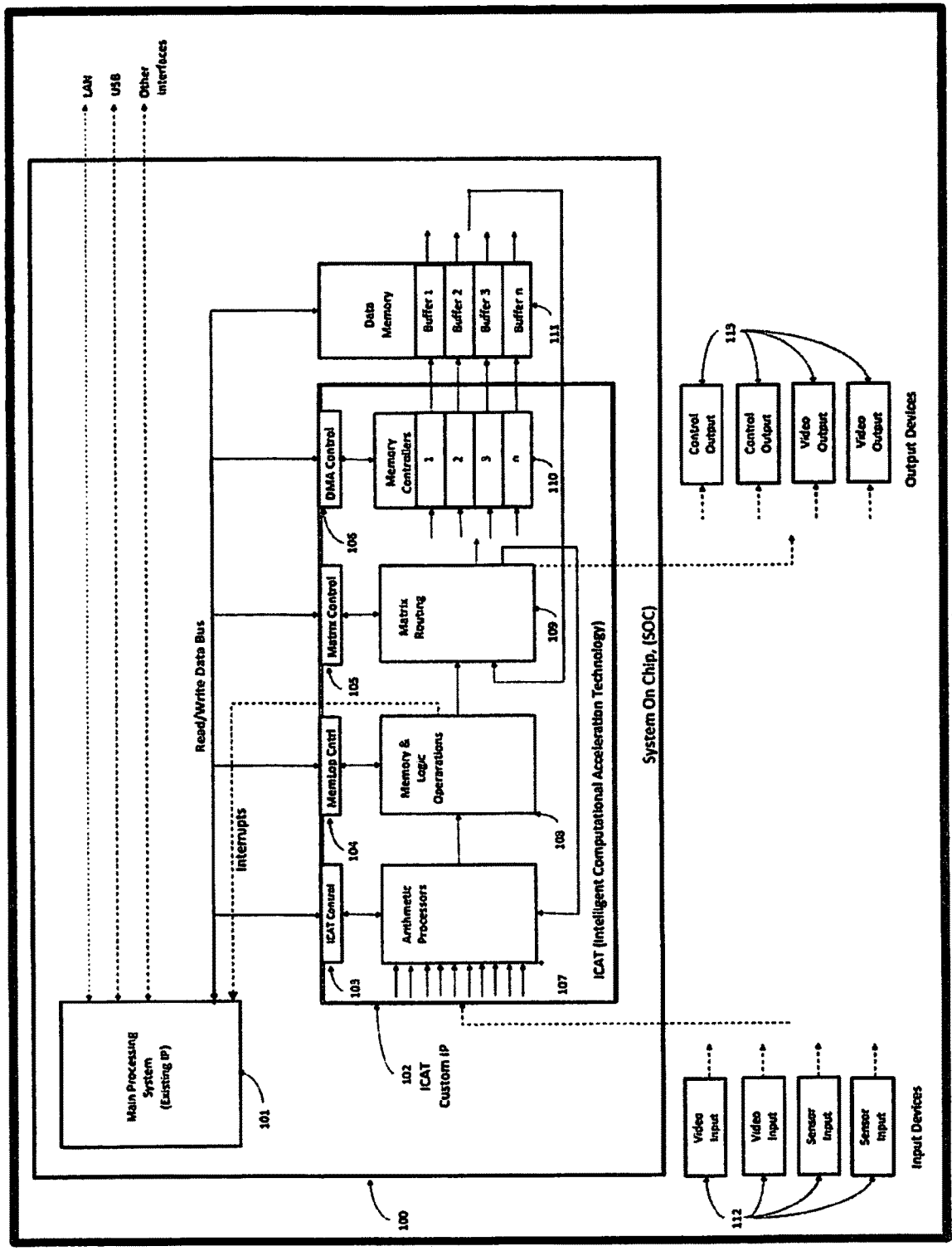
FIG. 4 is an example of an ICAT architecture.

FIG. 4 illustrates an example of an ICAT architecture. In one example, a conventional compiler, such as Visual Studio, may be used to generate an ICAT configuration program that runs on the main processing system 101. This provides a method for configuring and reconfiguring reprogrammable pools of hardware which are reconfigurable to run and process various type processing Algorithms in a chip. A conventional processing system (e.g. Intel, ARM, IBM, AMD microprocessors) cannot be reconfigured to run various algorithms, because only the software, not the hardware, can change in a conventional processing system. By using an ICAT architecture, all of the fetch and execute code instruction overhead of a conventional processing system is eliminated. The ICAT architecture of FIG. 4 provides a re-configurable hardware configurable for performing efficient processing of data utilizing a pool of parallel processor resources implemented in a system on chip (SOC) device 100.

For example, a pool of mathematic processors 107, followed by logic processors 108 and configurable matrix routing 109 implements a pool of parallel processing resources 102. This architecture is capable of pipeline processing resources to optimize processing performance for particular applications. In one example, the pool of processors 102 perform multiple processing tasks, independently of the main processor 101, without receiving further instructions from the main processor. Each ICAT may be configured to process an entire algorithm as a standalone processor system. Thus, an ICAT can be considered a system within itself, requiring no overhead to complete processing of an algorithm, once configured to perform the algorithm. For example, an ICAT may be configured to perform an if-then-else instruction set and may be reconfigured, later, to perform a completely different instruction set, such as a fast Fourier transform or other mathematical algorithm solution.

By reducing unnecessary cycles of activity, the ICAT architecture reduces power consumption, generates less heat, and increases the speed of processing data, when compared to a conventional processor. The ICAT resources 102 are idle until they get configured, when data is ready to be processed at their inputs. All of the processors are kept in an idle state when not needed, reducing heat generated from any unnecessary overhead. Each processor in the pool of ICAT resources have less overhead than conventional processors, because the ICAT does not fetch and execute code. Instead, the hardware is configure to perform a specific operation and is only active when data is provided that needs to be processed with the configured algorithm provided by the ICAT architecture. In one example, a single ICAT processor uses a pool of mathematic processors 107, logic processors 108, and output steered by configurable matrix routing 109.

This same ICAT processor may be used for a simple processing task, such as an if-then-else, or for a very advanced complex algorithm, such as an algorithm used in facial recognition. By using a plurality of groups or pools of ICAT resources 102, a pool of mathematic processors 107, logic processors 108, and output steered by configurable matrix routing 109, the ICAT architecture may be used for processing tasks requiring a plurality of calculations in a pipelined architecture, such as motion, shape, or identity detection, for example.

In one example, the algorithm controls the interconnect bus structure of the ICAT processors, and the ICAT architecture processes input data streams from output devices 112, such as video, sensors or data from a previous process step. For example, prior results may be streamed from data memory buffers, live input data or any data from other processed steps 110, 111. Processing results may be output directly to devices 113, such as control output or video output, for example.

Figure 5:
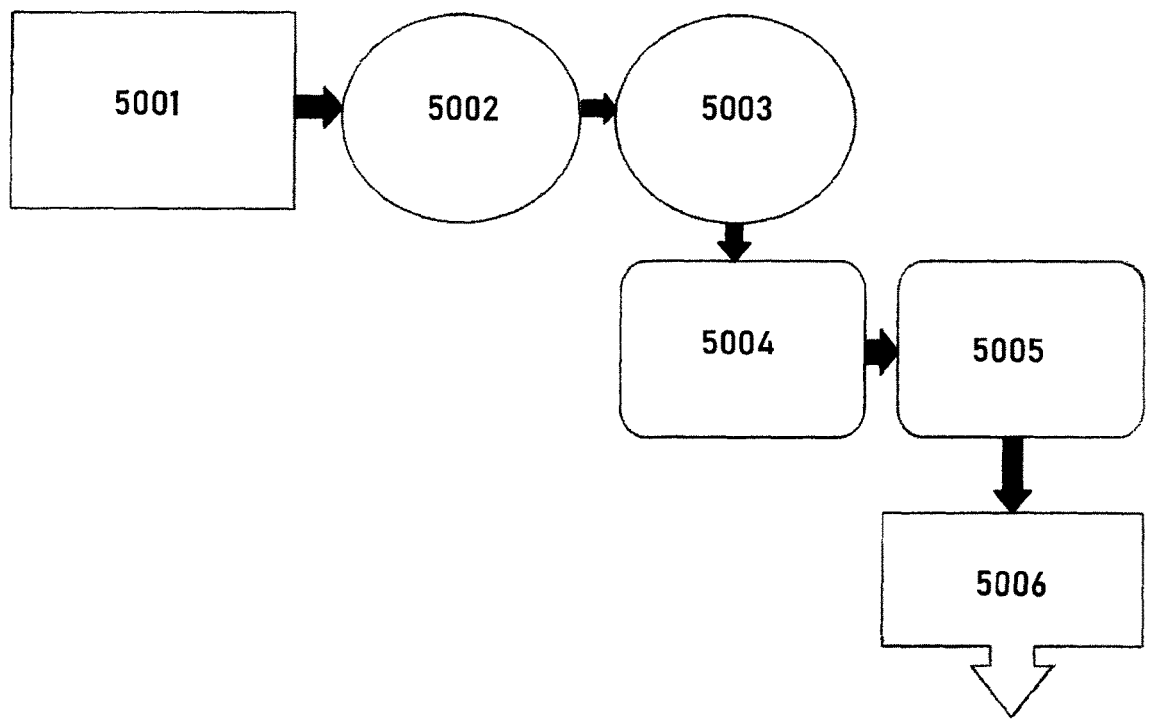
FIG. 5 shows a flow diagram of an example of how a programmer may use an AMPC.

A programmer may utilize the AMPC to configure a plurality of RAPC's as illustrated in the example of FIG. 5. Alternatively, the use of the AMPC may be automated and controlled onboard by a system on a chip, for example. FIG. 5 illustrates a 6 step flow diagram for a programmer, who initially inserts an original high level programming language source code into first compiler (the AMPC is referred to a ASML). The ASML pre-compiler extracts code from the original source in step 2, which occurs automatically. Then, the pre-compiler outputs new source code to a second compiler. This step can be done either automatically or as a separate step by the programmer, after the programmer is satisfied that the new source is debugged and optimized. This second compiler compiles a firmware build for the ICAT architecture. Then, the firmware is loaded into the ICAT architecture, and the firmware configures the RAPC's of the ICAT architecture. The programmer may upload this firmware into the ICAT architecture after the programmer is satisfied that the firmware is debugged and optimized, for example. Now looking at each step of FIG. 5, for example, in the first step 5001, original code algorithms are input, such as "C", MatLab, Math equations, or similar compiler source code software, and the ASML extracts 5002 the useful code in a first pre-compiler and compiles 5003 the useful code. Next, the pre-compiler outputs 5004 "C" source code to a second compiler, and the second compiler builds 5005 microprocessor firmware for the purpose of configuring ICAT(s). Then, the configuration is loaded 5006 into the configuration memory of the ICAT chip(s).

Alternatively, each of the steps may be automated and may occur without human intervention, except for loading the original source code into the ICAT architecture. By combining a conventional processor with a plurality of RAPC's and an AMPC, the entire process may be automated, such that the conventional processor runs the AMPC to recompile the original source code to generate firmware that is used by the conventional processor to set up the RAPC's, based on the instructions contained in the original source code.

Figure 6:
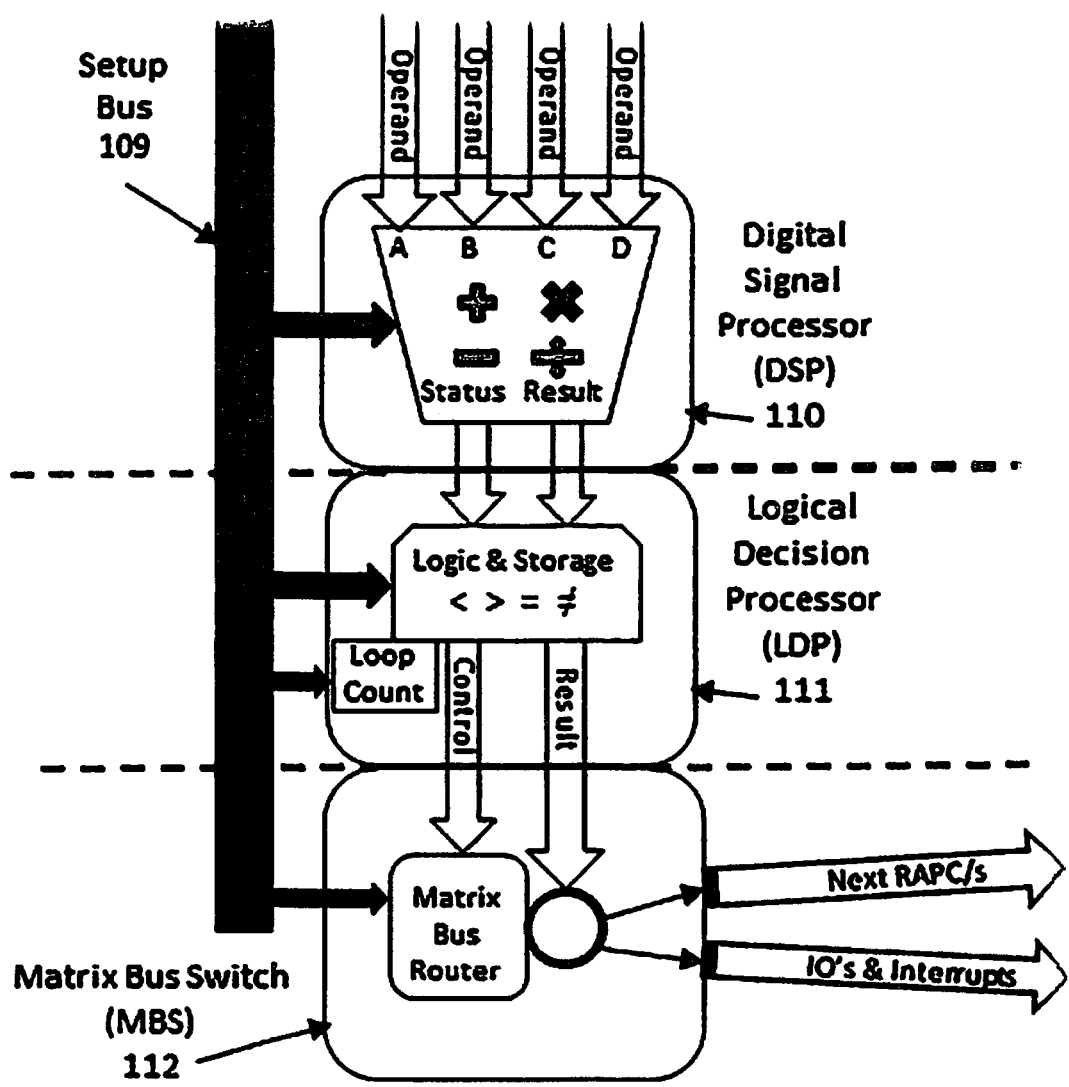
FIG. 6 is a schematic example of a reusable algorithmic pipelined computer.

A pool of ICAT resources may contain three types of processor modules, for example, such as mathematic modules, logical modules, and result routing modules. Mathematics modules perform math functions. Logic modules performs logic functions. Result routing modules perform branching and data routing functions. For example, in FIG. 6, A Reusable Algorithmic Pipelined Computer (RAPC) is illustrated schematically. A setup bus 109 is established by configuration of the setup registers of the ICAT architecture by the AMPC. Operands are directed to memory locations A, B, C and D on a digital signal processor (DSP) 110. The DSP is configured to execute an mathematical algorithm. Results of the algorithm are directed to a logical decision processor (LDP) 111. The LDP executes logical instructions. Results of the logical instructions are delivered to the next RAPC, directly or via the matrix bus switch (MBS). The MBS directs results to the next RAPC or controls inputs and outputs and interrupts for delivery of the results on a high speed streaming interface.

Hardware resources may be configured into ICAT co-processor systems that are interconnected in a pipelined structure for optimal performance. In one example, a method for designing reprogrammable pools of hardware resources, which are reconfigurable, run and process a plurality of processing algorithms in a chip. Hardware resources for configuring ICAT processors may be designed into the chip, and the hardware resources in the chip are re-configurable via AMPC. The architecture of an ICAT processing system is configured from the source code for processing algorithms, for example. Thus, code generated for a conventional processor may be run much more efficiently on an ICAT architecture, because the hardware of the ICAT processors is configured by the source code to perform algorithms independently of the processor using AMPC, for example. Thus, the ICAT architecture is capable of configuring the ICAT hardware architecture from source code created for a conventional microprocessor, which has not been known in the art. In one example, a pool of hardware resources are created that are configurable and reconfigurable into algorithmic matrix structures by a processor, and the pool of hardware resources then actually process a plurality of processing algorithms in a chip. In one example, the hardware resources process data through an plurality of commands independently of other processors using pipelining.

In one example, the ICAT architecture and algorithmic matching pipelining compiler combine to achieve results unknown in the art, achieving both speed of calculations and efficiency. For example, an AMPC configures hardware resources for running a plurality of processing algorithms. AMPC generates the configuration setup firmware used to configure processing algorithms from the pool of ICAT resources in an ICAT chip. This provides a programmer with a tool that accepts existing application source code, designed for a conventional processor and new source code designed for matching and assigning ICAT hardware resources to create individual hardware processing algorithms within the ICAT architecture. AMPC generates the firmware that runs the main processor to configure the ICAT hardware to perform a plurality of algorithms independent of the main processor, during operation of the SOC for a particular purpose.

Conventional processors use a similar architecture comprising program memory, fetch and execution hardware which is used for step by step execution of program instructions; data memory which is needed for storage of bulk (heap) data and program stack structures; and instruction fetch & execution cycles, management of program stack, and management of data heap storage which all create considerable overhead in a conventional processor architecture.

In contrast, in one example, an ICAT architecture eliminates almost all of the overhead of conventional processor systems. The ICAT hardware pool is configured by the AMPC and is used to processes algorithms using the ICAT co-processor architecture with pipelined streaming data structures. Thus, in one example, a method using the ICAT architecture comprises AMPC accessing ICAT hardware compiler tables defining the resources available in the chip; a hardware design language, such as Verilog, is used to compile the pool of ICAT hardware 102, for a given processor; hardware compilation outputs tables that define the structure of the ICAT resource pools within the chip; the AMPC uses these tables of data generated by the hardware compiler to determine the locations and quantities of ICAT resources in the chip; AMPC assigns hardware resources, configures math and logic operations, and creates interconnections for the various algorithms, wherein the source input syntax for the AMPC may be comprises of C # syntax or standard mathematic syntax, such as Matlab; the AMPC configures a pipelined structure for each algorithm from the pool of ICAT hardware resources that are available 103 . . . 111; and these pipelined structures form ICAT co-processors for each algorithm, for example. For example, the AMPC outputs code that runs on the main processing system 101 that configures the control registers 103, 104, 105, 106 of the resources that run algorithms on the parallel ICAT(s) co-processors 102.

A co-processor system structure may be configured from a pool of ICAT resources 102, which respond to input from a main processor 101, for example. Alternatively, a pool of ICAT resources 102 may generate interrupts and output data to the main processor 101 or input/output devices of the main processor 101, if the main processor architecture includes input/output devices separate from the main processor. In one example, a pool of ICAT resources 102 may be configured by a conventional processor 101, then the ICAT resources 102 run on their own until re-configured.

The ICAT architecture's processors will continuously process data streams in parallel, on their own, once the ICAT processors are configured by the firmware. In contrast, a conventional system requires endlessly going to memory and fetching instructions to determine the process flow at each processing step. The AMPC may assign a hardware group of resources, such as math logic and routing, for example, to a particular ICAT processor structure of the ICAT architecture in order to execute processing steps for the processing of a particular algorithm, for example. No conventional compiler selects and configures hardware structures of a micro-processor. For example, when the AMPC builds the hardware structure of the ICAT architecture it may configure the hardware resources for an ICAT architecture in a pipelined architecture that speeds processing performance. A conventional complier cannot do this.

In the example of FIG. 4, ICAT Control Registers 104 are a set of registers for controlling processing functions. For example, a digital signal processor (DSP) Input Mode Register may include Split Input Words, Pre-Adder Control, Input Register Bank Select and other DSP Input functions, DSP ALU Mode Register may control add, subtract, multiply, divide, shift right, shift left, rotate, and, or, xor, nor nand, and other logic processes, and DSP Multiplexor Selects may control Shifts and Input Selects. The DSP may utilize one DSP48E1 for each ICAT. For example, the DSP48E1 devices may be provided in a Xilinx 7 series of field programmable gate arrays. For example, an ICAT memory and logic operations 105 may be used to control memory and memory logic operations.

In one example, a motion detection algorithm is written in the C language for use on a general purpose computer.

Code example 1: motion detection algorithm written in the C language (a high level programming language)

```
int noise_threshold = 3;
int live_video_pixel = 0;
int black_video_pixel = 0;
boolean motion_detected = false;
int live_red_pixel = 0;
int live_green_pixel = 0;
int live_blue_pixel = 0;
int frame_delayed_pixel;
int frame_delayed_red_pixel = 0;
int frame_delayed_green_pixel = 0;
int frame_delayed_blue_pixel = 0;
int red_mask = 255; // 0000FF hex, 00000000000000011111111 binary, extracts bits 0 thru 7
int green_mask = 65,2280; // 00FF00 hex, 000000001111111100000000 binary, extracts bits 8 thru15
int green_divisor = 256
int blue_mask = 16,711,680; // FF0000 hex, 111111110000000000000000 binary, extracts bits 23 thru 16
int blue_divisor = 65,536
// Procedure to extract red, green, and blue pixels from live _video_pixel
void extract_live_red_green_blue (int live_video_pixel)
    {
        live_red_pixel = (live_video_pixel) ; // extract red pixel from live video
        live_red_pixel = live_red_pixel & red_mask
        live_red_pixel = (live_red_pixel / red_divisor)
        live green pixel = (live_video_pixel) ; // extract green pixel from live video
        live_green_pixel = live_ green_pixel & green_mask
        live_green_pixel = (live_green_pixel / green_divisor)
        live blue pixel = (live_video_pixel) ; // extract blue pixel from live video
        live_blue_pixel = live_blue_pixel & blue_mask
        live_blue_pixel = (live_blue_pixel / blue_divisor)
    }
    //Procedure to extract red, green, and blue pixels from delayed_frame_video_pixel
void extract_delayed_red_green_blue (int frame_delayed_video_pixel) ;
  {
    frame_delayed_red_pixel = (live_video_pixel) ; // extract red pixel;
        frame_delayed_red_pixel = (frame_delayed_red_pixel & red_mask) ;
    frame_delayed_red_pixel = (frame_delayed_red_pixel / red_divisor);
    frame_delayed_green_pixel = (live_video_pixel) ; // extract green pixel
frame_delayed_green_pixel = (frame_delayed_green_pixel & green_mask) ;
    frame_delayed_green_pixel = (frame_delayed_green_pixel / green_divisor);
    frame_delayed_blue_pixel = (frame_delayed_video_pixel) ; // extract blue pixel
      frame_delayed_blue_pixel = (frame_delayed_ blue_pixel & blue_mask)
      frame_delayed_blue_pixel = (frame_delayed_blue_pixel / blue_divisor)
  }
            // Procedure for motion detection algorithm
        boolean motion_detected detect_motion ( ) ;
{
    motion_detect = false; //get ready to detect motion
    result_red_pixel = (frame_delayed_red_pixel - live_red_pixel) ; // subtract red pixels
    if (result_red_pixel > noise_threshold) // test if red_result is greater than noise threshold
    {
motion_detected = true; // motion was detected on red pixel
    } // end if (result_red_pixel > noise_threshold)
    result_green_pixel = frame_delayed_green_pixel - live_green_pixel; // subtract green pixels
    if (result_green_pixel > noise_threshold) // test if green_result is greater than noise threshold
            {
                motion_detected = true; // motion was detected on green pixel
            } // end if (result_green_pixel > noise_threshold)
    result_blue_pixel = frame_delayed_green_pixel - live_green_pixel; // subtract green pixels
    if (result_blue_pixel > noise_threshold) // test if blue_result is greater than noise threshold
            {
                motion_detected = true;
            } // end if (result_blue_pixel > noise_threshold)
```

```
                return motion_detected; // motion was detected on blue pixel
            } // end of motion detection algorithm
            // Procedure for one frame of video, (Executed for each frame of video)
            do // process all pixels for each frame (hd = 777,600 pixels per frame)
                // (31 instructions executed for each pixel)
                {
                    if (pixel_clock = true); // pixel_clock is from the live video stream, hd = 46.656 MHz,
                    { // extract red, green, and blue pixels from live video and delayed video pixels
                        frame_delayed_pixel = delay_buffer_output_pixel; // get a frame delayed video pixel
                        live_video_pixel = live_video_input_pixel; // get a live video pixel
                    extract_live_red_green_blue (int live_video_pixel) ; // extract live color pixels, (9
instructions/pixel)
                    extract_delayed_red_green_blue (int frame_delayed_pixel); // extract delayed color
pixels, (9 instructions/pixel)
                    } //end if (pixel_clock = true)
motion_detect = detect_motion( ); // call function to detect motion (11 instructions/pixel)
if (motion_detect = true); // motion_detect swaps the processing of video outputs 1 and 2
                    {
                        output1; // Only moving video is displayed. Non-moving video is black.
                        output2; // Only non-moving video is displayed. Moving video is black.
                    } // end if (motion_detect = true)
if (motion_detect = false); // motion_detect swaps the processing of video outputs 1 and 2
                    {
                        output 1; // Only non-moving video is displayed. Moving video is black.
                        output2; // Only moving video is displayed. Non-moving video is black.
                    } // end if motion_detect = false)
until (end_of_frame = true) ; // end_of_frame is a signal in the video stream
```

Figure 7:
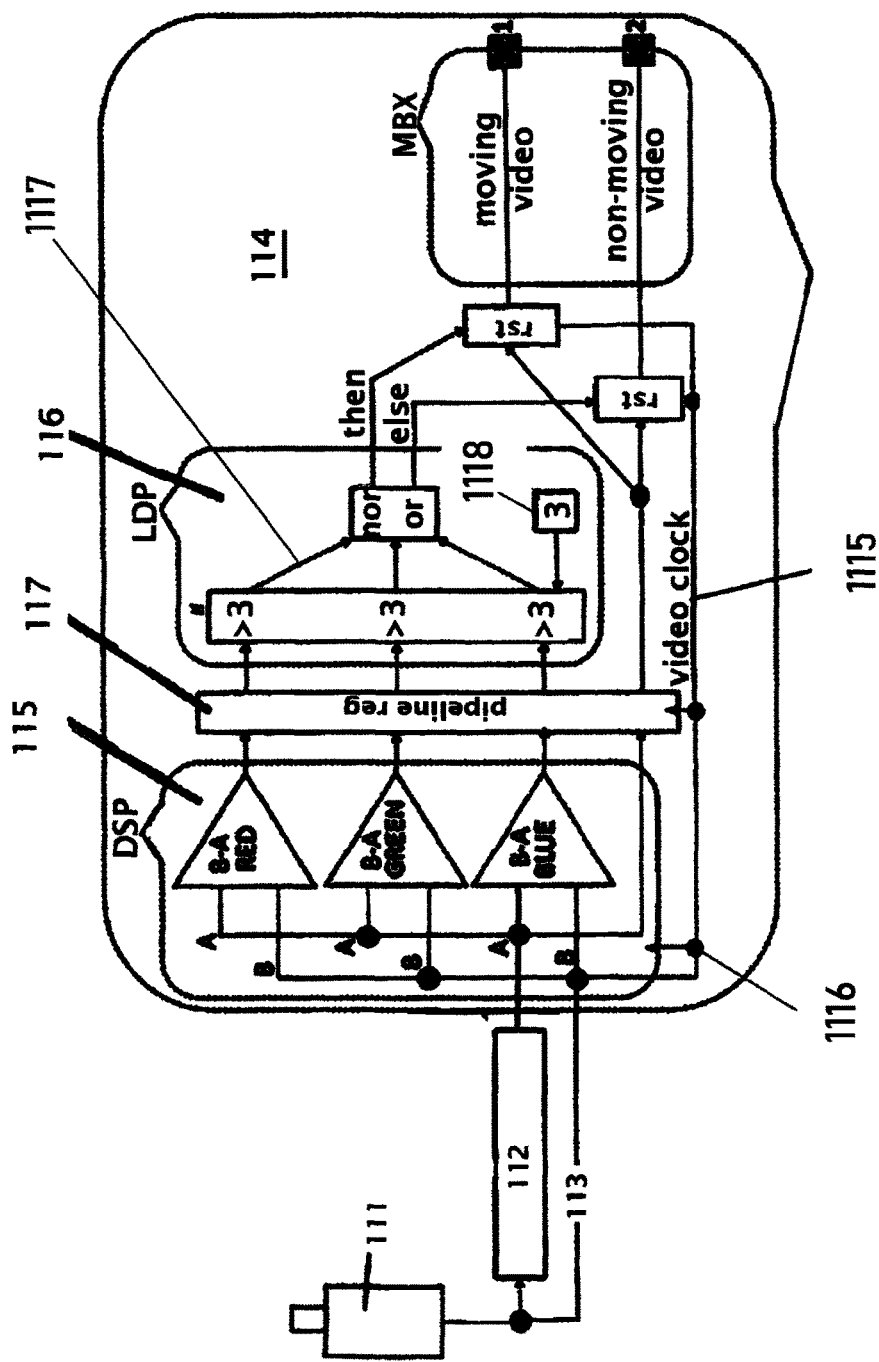
FIG. 7 shows a schematic illustration of a diagram of a hardware configuration resulting from a compilation of Code Example 1 with an AMPC compiler.

FIG. 7 shows a schematic illustration of a diagram of a hardware configuration resulting from a compilation of Code Example 1 with an AMPC compiler. A video device 111 has two outputs: a stream of live video pixels 113 and a frame delay buffer stream 112. For RGB output, each pixel comprises red, green and blue. The DSP 115 performs a comparison of the live feed and the delayed feed, and the result is pipelined 117 to the LDP 116, which determines if motion is detected. The result is output by the MBS of the RAPC 114. A single RAPC is configured to implement the 3 processing blocks that execute in parallel every clock cycle. In comparison, a conventional processing system requires execution of 37 instructions to process each pixel of video to detect motion. Most of these instructions take more than 3 clock cycles when executed on a conventional, non-reconfigurable and non-pipelined, processor. Even if an average instruction executed in 3 clock cycles, which is being generous for non-optimized, general purpose processors, nevertheless, it would take 111 CPU clock cycles to process each pixel. As the number of pixels increases on modern cameras, it is clear that the cycle times available from modern single and multi-core processors are inadequate for the job. In FIG. 7, the pipeline registers 1115 may be inserted for each clock to keep output timing synchronized. For example, the video clock is the main clock for the RAPC processor and video output drivers. The vertical & horizontal sync, frame end, and pixel data 1116 are accessible. The noise threshold constant 1118, e.g. 3, may be provided, and a motion detect signal 1117 exceeding the noise threshold constant may be output for each of the RGB channels, as shown in FIG. 7, for example.

In contrast, the example configuration of the single RAPC processor configured by an AMPC compiler from Code Example 1 processes a continuous stream of pixels using the video's pixel clock. Three processing blocks (DSP, LDP, and MBS) are implemented in a pipelined, streaming configuration of FPGA's with three clock cycles of latency, but each clock cycle after the pipeline is filled (after the first three clock cycles of the video's pixel clock) processes output of a pixel, which is one pixel per clock cycle compared to one pixel per 111 clock cycles. As a result, a single RAPC performs at least 111 times faster than a single core of a conventional processing system, i.e. a pixel is process each clock cycle on the ICAT compared to 37 instructions×3 clock cycles per instruction or 111 clock cycles per pixel for the conventional processor. Since two thousand (or more) RAPC processors may be implemented on a single ICAT chip, the combined processing power could be at least 222,000 faster than a single core conventional processor. Current conventional processors are limited to quad core or the like, but adding cores to a conventional processor is not without additional overhead. Many more RAPC's can be added than conventional processing cores, and each can be reconfigured as a pipeline alone or together with other RAPC's.

The point of Code Example 1 and FIG. 7 is that adding RAPC's is simply a matter of density and size of a chip and thousands may be added to an ASIC without adding overhead. Each RAPC is a piplined, parallel processor. Therefore, adding cores, adding cache memories, and overclocking of conventional processors could never get a conventional processor anywhere near the performance of a single ICAT chip with a couple dozen RAPC's. Plus, all of the effort to push conventional processors results in excessive heat, cost, and size for a conventional, non-reconfigurable and non-pipelined, processor. Not to mention, that these same methods could be used to increase performance of the RAPC's of the ICAT architecture, also. Regardless, adding RAPC's to the ICAT architecture will always improve performance, dramatically, over a comparable conventional processor architecture, without the need for programmers to program specifically for the ICAT architecture. This is a surprising and unexpected result. All of the attention is focused on getting more out of conventional processors, while little attention has been given to adding programmable, reconfigurable architectures to conventional processors for enhancing performance of general purpose processors.

Also, implementing the same solution for Code Example 1 on standard FPGA's would require more than merely recompiling a standard high level programming language, as provided in this example. To successfully develop a matrix multiplier, PID or any complex algorithm, in a Xilinx FPGA, for example, requires the following skills: a working knowledge in designing circuitry with RTL and Verilog languages; advanced architecture skills (parallel processing, pipelining, data streaming, resource/performance tradeoffs, etc.); design experience with a wide variety of hardware building blocks, such as arithmetic, logical decision making, memory devices, controller devices, peripheral interfaces, etc.; software design; a working knowledge with various versions of higher level programming languages; a working knowledge with mathematic algorithms used in monitoring and control applications; and a knowledge of how to use Xilinx software tools, such as compiling "C" code to Xilinx hardware; verifying hardware design and making architecture modifications if needed to meet performance goals; building "C" code test bench; verifying hardware simulation results against test bench results; and implementing design in hardware and testing it. All of this makes a typical FPGA project both timely and costly, well beyond the ability of a person having ordinary high level language programming skills. Current state of the art reserves FPGA's for niche processing where performance is paramount and the delays and costs of custom design and programming are acceptable.

In contrast, any good high level language programmer can program ICAT technology, because the front end, the microprocessor architecture is a familiar, general purpose architecture. The RAPC's are configured by the general purpose processor and the AMPC, which uses the standard structure of each RAPC to reconfigure one or more RAPC's, based on standard code for the front end processor, as illustrated in the diagram of FIG. 7, for example. Thus, the ICAT technology, including a plurality of the RAPC's and an AMPC for configuring and reconfiguring the RAPC's using a standard processor architecture facing the world, is a surprising and unexpected advance over conventional processors and any known FPGA processors.

Figure 8:
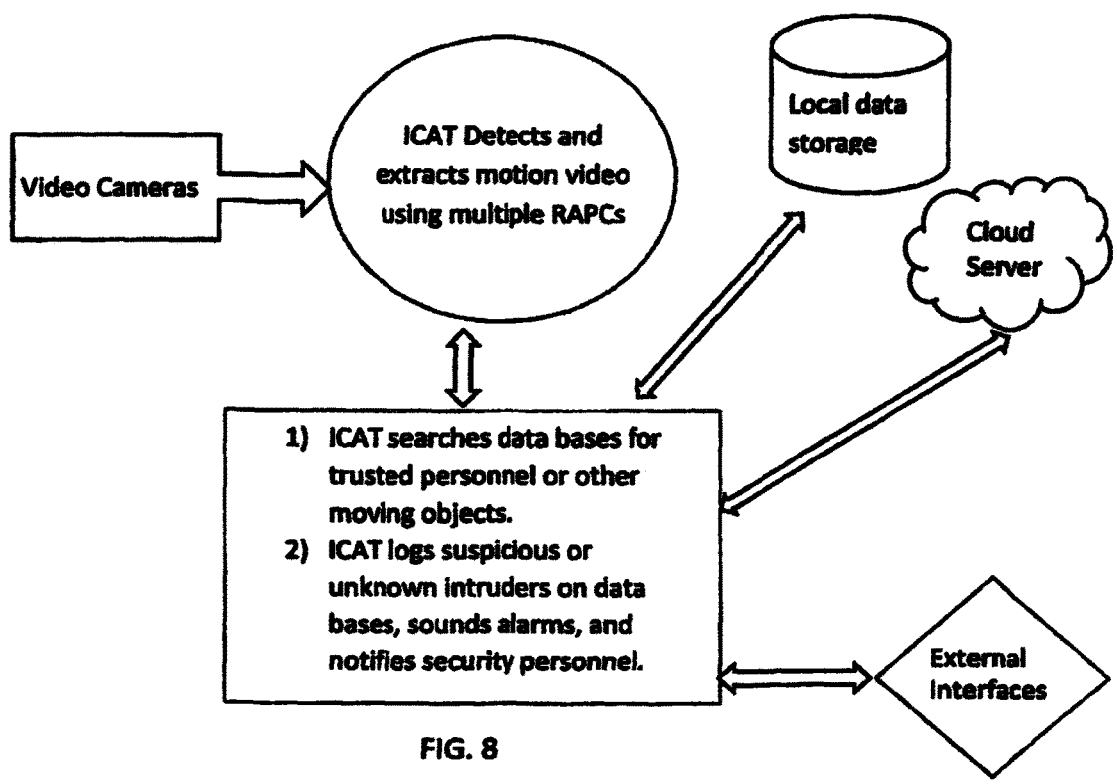
FIG. 8 illustrates a dramatic benefit from the raw processing power of the example of FIG. 7 by real time lossless data compression in a consumer electronic device.

FIG. 8 illustrates an application of a microprocessor combining a reusable algorithmic pipelined core with an algorithmic matching pipelined compiler. The lack of video processing speed of conventional microprocessors requires either specialized and expensive chip sets or post processing. As shown in the drawing, a general purpose processor with RAPC and AMPC yields a solution that processes millions of pixels in real time, providing motion sensing, video compression and faster upload and download speeds for video from a general purpose ICAT chip onboard a consumer electronic device, for example.

Each RAPC may comprise a DSP, an LDP and an MBS. A DSP may have a setup interface for programming the types of operations required, (i.e. integer and floating point, multiply, divide, add, subtract, etc.). A DSP may have four inputs for operand data that can be concatenated or operated on with various combinations of mathematic functions as determined by the setup data, such as illustrated in FIG. 8. The DSP may have a 48-bit accumulator which is output as result data along with the status data. Status data includes, carry out, equal, greater than, and less than, for example.

An LDP may have a setup interface for programming the lookup table, the loop counter, and the constant register, for example. The LDP may have a Loop Counter for detecting when iterative algorithms are completed. The LDP may have a register that can hold constant data for input to the lookup table. The LDP may have a block of memory that can be used to perform functions. LUT functions may include a lookup table that can be implemented and sequentially accessed using the loop counter; a lookup table that can be implemented and accessed by the DSP status, the constant register, or the DSP result data for control purposes; and a logic lookup table that can be implemented and output miscellaneous logic signals for control purposes. The LDP may pass result data from its input to its output. The LDP may have one pipeline register for result data at its output, for example. Alternatively, the LDP may have two pipeline registers with synchronous clear enables for result data at its output.

This detailed description provides examples including features and elements of the claims for the purpose of enabling a person having ordinary skill in the art to make and use the inventions recited in the claims. However, these examples are not intended to limit the scope of the claims, directly. Instead, the examples provide features and elements of the claims that, having been disclosed in these descriptions, claims and drawings, may be altered and combined in ways that are known in the art.

For example, without being limiting in any way, 3325 RAPC's may be configured on a single Xilinx® Zynq® FPGA chip, where Xilinx® and Zync® are trademarks of Xilinx, Inc., running at a modest clock rate of 100 MHz. On each clock, each of the RAPC's can process 1 or 2 logic operations and a mathematic operation. Thus, this configuration produces 332 GigaFLOPS. For example, this configuration uses look up tables (LUT) for each of four mathematical operations (e.g. add, subtract, multiply, divide) and four logic operations (e.g. greater than, less than, equal, not equal). The standard LUT memory size is 512 bytes. In addition, a "greater than a configurable constant value" LUT may be provided, in addition to the other logic operation LUT's. In one example, the output signals of the LUT's are used to control the bus multiplexor switches for steering results between RAPC's. The AMPC compiler precompiles source code of a higher level program language written for a von Neuman architecture, and the AMPC compiler selects LUT's for each operation being performed by a RAPC, generating a non-von-Neumann processor from source code written for the von Neumann architecture.

As compared to any conventional, von Neumann processor, the 332 GigaFLOPS, where a GigaFLOPS is defined as 1 billion floating point operations per second, is respectable, especially when it is understood that this is obtained without any special cooling requirements for the chip. In comparison, a conventional von Neumann processing system requires separate fetch and execute cycles for each math, logic and branch operation, while RAPC's do not require separate fetch and execute cycles for each math, logic and branch operation.

In one example, calculations show that a Xilinx® Virtex ZU 13 chip, where Xilinx and Virtex are trademarks of Xilinx, Inc., with a 741 MHz clock speed, can be configured with 236,250 RAPC's, giving this chip the capability of performing at greater than 175,000 gigaFLOPS, which is an extraordinary result, both unexpected and surprising to those skilled in the art. This result is possible, because the RAPC does not require a separate fetch and execute cycle for each math, logic and branch operation performed. This and other problems raised by the von Neumann architecture of general purpose computer processors are solved using RAPC's and the architectures described herein. Programs written for processors with a von Neumann architecture (i.e. all known, modern general purpose processors) do not need to be rewritten to run on the described architecture, a very surprising and unexpected result to those of ordinary skill in the art and even experts in this art.

What is claimed is:

1. A precompiler comprises an algorithmic matching pipelined compiler, wherein the algorithmic matching pipelined compiler comprises a processing unit, and the algorithmic matching pipelined compiler is configured to precompile a standard higher level software language written for a type of conventional non-reconfigurable processor, and the algorithmic matching pipelined compiler generates machine code for one or more reusable cores by using the processing unit, wherein the machine code provides instructions for configuring the one or more reusable cores, such that the one or more reusable cores are capable of being configured or reconfigured to independently solve complex mathematical and logic algorithms without further intervention by the processing unit after the algorithmic matching pipelined compiler configures the one or more reusable cores, wherein the processing unit is disposed on a chip.

2. The precompiler of claim 1, wherein the processing unit is disposed on the chip with the one or more reusable cores, and the one or more reusable cores comprise a plurality of reusable cores.

3. A method of using a precompiler comprises an algorithmic matching pipelined compiler with a processing unit, the method comprising:
    precompiling, by the processing unit, a standard higher level software language written for a type of conventional non-reconfigurable processor;
    generating, by the processing unit, machine code for one or more reusable cores, wherein the machine code provides instructions for configuring the one or more reusable cores, such that the one or more reusable cores are configured or reconfigured to independently solve complex mathematical and logic algorithms without further intervention by the processing unit after the algorithmic matching pipelined compiler configures the one or more reusable cores; and
    independently solving complex mathematical and logic algorithms without further intervention by the processing unit using only the one or more reusable cores as configured or reconfigured by the precompiler.

4. The method of claim 3, further comprising:
    generating machine code for one or more of the one or more reusable cores, wherein the one or more reusable cores comprise a plurality of reusable cores, wherein at least one of the plurality of reusable cores were not configured in the previous step of generating machine code for the one or more reusable cores, wherein the machine code provides instructions, in real time, for configuring the at least one of the plurality of reusable cores that were not previously configured in the previous step of generating machine code for the one or more reusable cores, before reconfiguring one or more of the one or more reusable cores that were configured in the previous step of generating machine code for the one or more reusable cores, such that the one or more reusable cores are configured or reconfigured to independently solve complex mathematical and logic algorithms, without further intervention by the processing unit, while at least one of the one or more reusable cores configured in the previous step of generating machine code for the one or more reusable cores is not reconfigured and continues to be used to independently solve complex mathematical and logic algorithms, without further intervention by the processing unit.

5. The method of claim 4, wherein the step of generating machine code for the one or more of the one or more reusable cores uses a logic to determine which of the one or more of the one or more reusable cores to reconfigure and the logic selected is a first in first out or a last used basis.

6. The method of claim 5, wherein the logic selected is a last used basis.

7. The method of claim 5, wherein the logic selected is a first in first out basis.

8. The method of claim 3, further comprising receiving reusable core hardware data from a hardware compiler.

9. The method of claim 8, wherein the hardware compiler is a Verilog or Vivado hardware compiler.

10. The method of claim 9, wherein the step of generating writes configuration data for setup registers.

11. The method of claim 3, further comprising outputting data from one or more of the one or more reusable cores on each subsequent clock after a latency period.

12. The method of claim 3, wherein the one or more reusable cores are one or more reusable algorithmic pipelined cores.

13. The method of claim 12, wherein the one or more reusable algorithmic pipelined cores are configured in the step of generating using field programmable gate arrays.

14. The method of claim 3, further comprising:
    filtering the standard higher level software language written for the type of the conventional non-reconfigurable processor; and
    identifying the complex mathematical and logical algorithms capable of being optimized by configuration of the one or more reusable cores.

* * * * *